United States Patent
Filek

[19]

[11] Patent Number: 6,041,726
[45] Date of Patent: Mar. 28, 2000

[54] OIL TANKER HULL ASSEMBLY AND METHOD OF OPERATION

[76] Inventor: Lawrence T. Filek, 507 W. Briarwood Ave., Littleton, Colo. 80120

[21] Appl. No.: 09/118,807

[22] Filed: Jul. 20, 1998

[51] Int. Cl.[7] .................................................... B63B 25/08

[52] U.S. Cl. ........................................................ 114/74 R

[58] Field of Search ............................. 114/72, 73, 74 R, 114/74 A, 74 T

[56] References Cited

U.S. PATENT DOCUMENTS 5,247,896  9/1993  Vosper .................................. 114/74 R

*Primary Examiner*—Ed Swinehart
*Attorney, Agent, or Firm*—Phillip A. Rein

[57] ABSTRACT

An oil tanker ship having an oil tanker hull assembly and method of operation operable to prevent oil spillage in case of an accidental hull rupture. The oil tanker assembly includes 1) an inner main tank oil cargo assembly to receive, support, and convey a primary oil cargo; and 2) an outer hull tank oil cargo assembly adapted to receive and convey a secondary oil cargo therein and mounted about and enclosing the inner main tank oil cargo assembly. The outer hull tank oil cargo assembly is provided with a plurality of compartment bulkhead assemblies operable to divide same into a plurality of spaced adjacent compartmentalized hull tanks with each one independently operable on being ruptured to prevent oil spillage into the surrounding sea water. The compartment bulkhead assemblies are each provided with an upper top surface engineered and positioned below a sea level line when obtaining a full load of oil cargo therein. A breach of a respective compartmentalized hull tank utilizes the force of gravity and pressure of sea water through the hull tank breach or rupture to move the secondary oil cargo in the ruptured compartmentalized hull tank upwardly over the top surface into adjacent ones of the compartmentalized hull tanks to prevent oil spillage to the adjacent sea water.

12 Claims, 3 Drawing Sheets

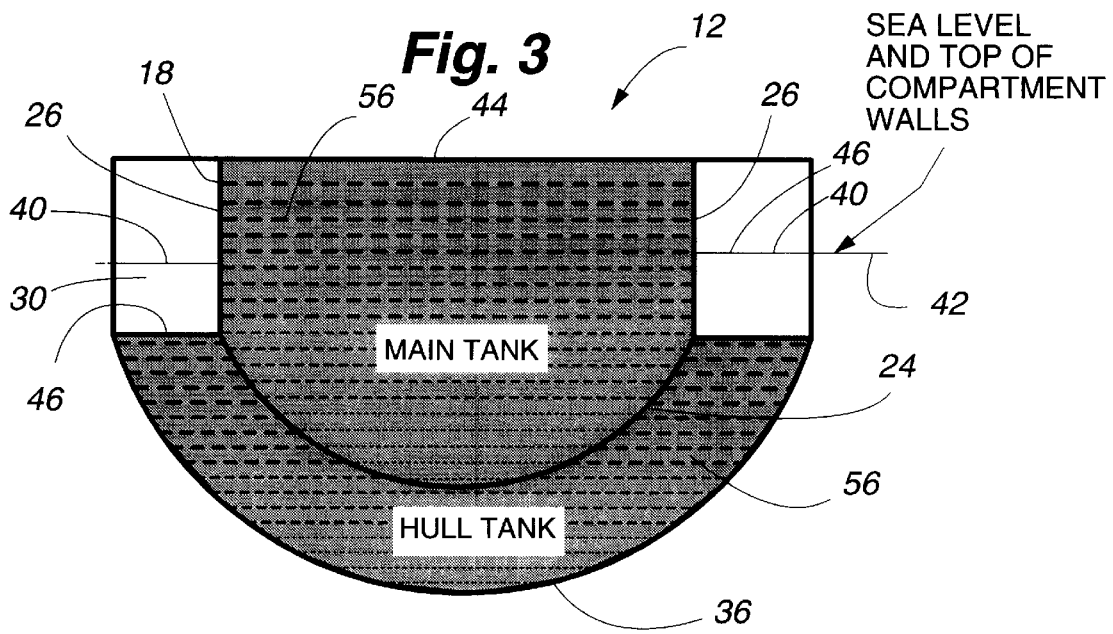
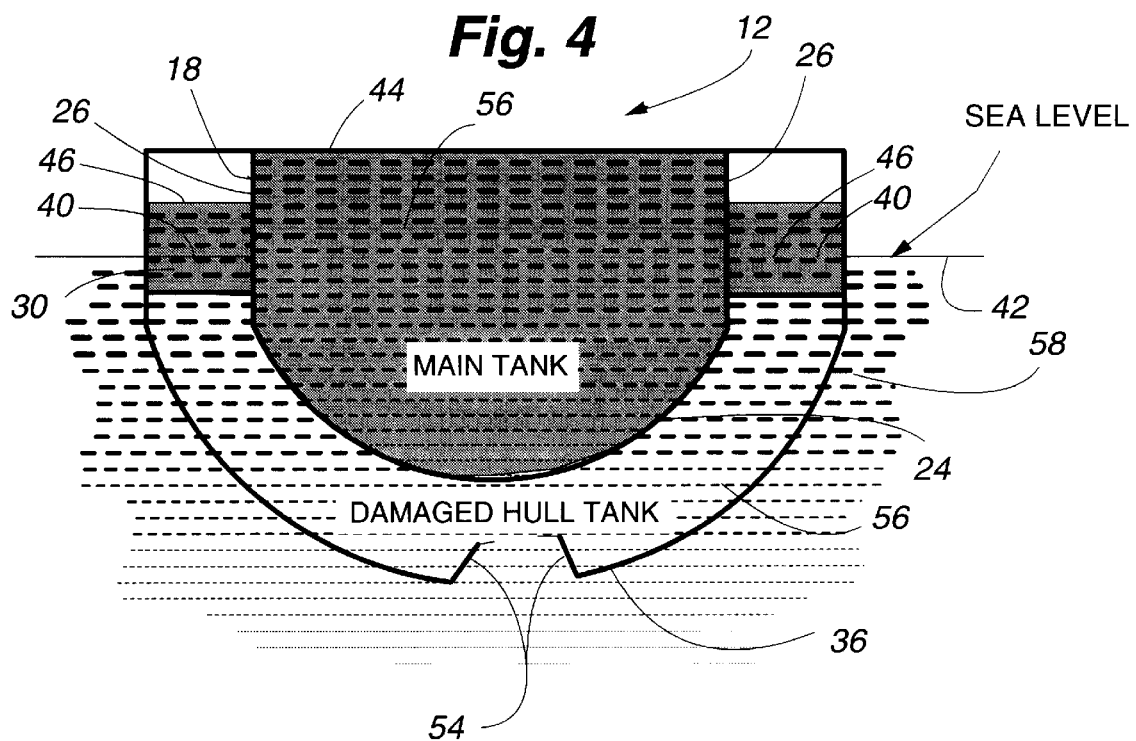

OIL TANKER HULL ASSEMBLY AND METHOD OF OPERATION

PRIOR ART

A patent search was conducted on this invention and the following United States patent references are noted:

| U.S. Pat. No. | Invention | Inventor |
|---|---|---|
| 5,086,723 | DOUBLE-HULLED VESSEL CONSTRUCTION HAVING VERTICAL DOUBLE-WALLED LONGITUDINAL BULKHEAD | Goldbach et al |
| 5,156,109 | SYSTEM TO REDUCE SPILLAGE OF OIL DUE TO RUPTURE OF SHIP'S TANK | Mo Husain |
| 5,271,350 | OIL TANKER APPARATUS | Babette B. Newburger |
| 5,320,055 | DOUBLE-LAYERED VESSEL WALL CONSTRUCTION WITH LONGITUDINALLY STAGGERED CELL-TO-CELL ACCESS OPENINGS THROUGH WALL LAYER-CONNECTING PLATES | Robert D. Goldbach |
| 5,349,914 | LEAKPROOF OIL SUPER-TANKER | Lapo et al |
| 5,520,131 | APPARATUS AND METHOD FOR ACCOMMODATING LEAKED OIL WITHIN A DOUBLE-HULLED TANKER AFTER SUFFERING GROUNDING DAMAGE | Robert D. Goldbach |
| 5,582,124 | HYBRID FRAMING SYSTEM FOR VESSELS | Sikora et al |

Enclosed is a copy of "Mobil Oil Company" disclosure of a double hulled oil tanker with a safety zone 13 feet wide between the hull walls.

As we all know, a great disaster occurs when an oil tanker has its hull ruptured by another vessel, iceberg, or other obstacle which ten contaminates the surrounding sea area with spilled oil and kills wildlife.

An oil tanker of the prior art is provided with a main tank which is filled with oil which may extend considerably above a surrounding water line. When a prior art oil tanker is ruptured and, due to higher oil level in the main tank, the oil is then forced outwardly by gravity pressure of the oil in the main tank into the surrounding sea area.

In our invention, we have the main tank surrounded with a hull tank which has a physical separation or width between the walls of 5–25 feet. Further, along the length of the oil tanker, these hull tanks are compartmentalized meaning that they have separation walls or compartment bulkheads therein and, therefore, they are of a limited length and size.

Oil is conveyed within that 5–25 foot hull separation area and having a "hull tank oil cargo line" below the water line.

On a rupture of an outer skin of the hull tank, the sea water will rush in due to the greater pressure achieved by the water line being above the hull tank oil cargo line. This will then move the oil, which has a less density than the sea water, upwardly to the top of the compartment bulkheads which will then equalize itself when the pressure through the rupture line plus the oil which is moving upwardly equalizes. This will eliminate or greatly minimize any oil spill that may occur as a result of the ruptured outer skin of the hull tank.

The Goldbach et al U.S. Pat. No. 5,086,723 discloses a double-hulled vessel construction having vertical double-walled longitudinal bulkhead teaching steel construction with curved plate panels but is not deemed pertinent to our invention.

The Goldbach U.S. Pat. No. 5,320,055 discloses a double-hulled or double-layered vessel constructed with vertically and longitudinally staggered access openings.

The Husain patent discloses a system to reduce spillage of oil due to rupture of ship's tank and operates on pressure differential but does not disclose building a dual walled containment section.

The Newburger patent discloses an oil tanker apparatus having an inner cargo carrying bladder to receive oil therein and being protected on various sides by buffer bladders which can contain pressurized air or water as ballast therein.

The Goldbach U.S. Pat. No. 5,520,131 patent discloses the use of a dual-hulled tanker vessel and utilizing variations in pressure achieved by the specific gravity of oil versus sea water to provide for the movement of the ruptured oil to an acceptable level therein.

The Lapo et al patent discloses a leakproof oil super-tanker which is for to stop or impede the spilling of liquid oil cargo from a damaged hull of a water traveling vessel. This structure is used as a mechanical type liner structure having a protective layer mounted between an outer rigid hull and having an inner flexible layer therein with a wire mesh to add to its strength and resistance to puncture during a collision.

The Sikora et al patent discloses a hybrid framing system for vessels which teaches a double-hulled vessel but has complex framing systems to protect an inner one of cargo carrying areas and is not deemed pertinent to your invention.

PREFERRED EMBODIMENT OF THE INVENTION

In one preferred embodiment of this invention, an oil tanker hull assembly and method of operation is operable to prevent oil spillage in case of accidental hull rupture. This invention is related to the new, modern super capacity oil tanker ships which can be constructed with the oil tanker hull assembly of this invention.

The oil tanker hull assembly includes 1) an inner main tank oil cargo assembly operable to receive, support, and convey, a primary oil cargo therein; and 2) an outer hull tank oil cargo assembly to be constructed in compartmental units or bulkheads and enclosing and surrounding the inner main tank oil cargo assembly.

In the case of an accident which could be the hitting of a reef or an iceberg, the outer hull tank oil cargo assembly will be ruptured which forces a secondary oil cargo therein to move upwardly due to pressure differentials and density differentials between an oil cargo and sea water to prevent spillage therefrom into surrounding sea water.

The inner main tank oil cargo assembly is provided with an arcuate bottom wall member which is integral with spaced parallel side wall members and enclosure end wall members.

The inner main tank oil cargo assembly provides a large reservoir having an immense primary oil cargo contained therein. An upper main tank oil cargo line is substantially above sea level and being spaced inwardly from an outer side wall member of the outer hull tank oil cargo assembly. Any outer hull tank breach or rupture on an outer wall member would not penetrate the side wall member into the inner main tank oil cargo assembly.

The outer hull tank oil cargo assembly is provided with compartment bulkhead assemblies operable to provide a plurality of adjacent spaced compartmentalized hull tanks extended throughout the outer length and periphery of the inner main tank oil cargo assembly.

Each compartment bulkhead assembly is provided with a bulkhead bottom wall member and integral bulkhead side wall members and formed with an outer wall member to form the compartmentalized hull tanks.

The bulkhead side wall members each have a top surface therein preferably at a height equal to an outer sea level to a floating oil tanker ship when the main tank and all of the hull tanks are filled to predetermined, calculated capacity.

Each of the compartmentalized hull tanks are separated by the compartment bulkhead assemblies and, during use, are filled with oil up to a hull tank oil cargo line. The hull tank oil cargo line is substantially below the top surface of the bulkhead side wall members which is substantially aligned with the sea level or exterior water line on the oil tanker ship for reasons to be explained.

This invention involves various known principles as to use of negative pressure on the inside of the hull tank oil cargo assemblies relative to the pressure of sea water on an outside of subject compartmentalized hull tanks.

As shown in FIG. 3, the inner main tank oil cargo assembly is filled with the primary oil cargo and having a main tank oil cargo line therein substantially elevated from the sea level line. The outer hull tank oil cargo assembly is filled with oil cargo to the hull tank oil cargo line which is below the sea level line.

In the method of operation, the main tank and the hull tanks are filled concurrently with oil cargo in such a manner so as to equalize pressures therein between the various compartment bulkhead assemblies relative to the outer wall member and inner wall member. Concurrent and controlled loading of the oil cargo assures that pressure being equalized can save construction costs as designing the spaced compartment bulkhead assemblies of a minimum required thickness plus leaving as much area as possible to carry the oil cargo.

The oil tanker ship is filled with its' oil cargo as noted in FIG. 3 having 1) the various lines noted therein wherein the sea level line is equal to the top surfaces of the bulkhead side wall members; 2) the main tank oil cargo line is filled to capacity having an upper maximum level therein; and 3) the hull tank oil cargo line is shown as below the sea level line.

On rupture of the hull tank by a hull tank breach or failure, as noted in FIG. 4, due to pressure differential and density of the sea water relative to the oil cargo, the sea water would then rush through the hull tank breach into the compartmentalized hull tank that has been ruptured. This then forces the lighter density oil cargo upwardly therein so that it will eventually rise above the top surfaces of the adjacent bulkhead side wall members and flow to adjacent ones of the compartmentalized hull tanks.

This will eventually equalize itself as shown in FIGS. 4 and 6 so that the sea water, which has rushed inwardly to take the place of the oil cargo in the ruptured compartmentalized hull tank, forces the oil upwardly and over the top surfaces of the bulkhead side wall members into adjoining adjacent ones of the compartmentalized hull tanks.

Due to the pressurized difference in lighter weight of the oil cargo, this would prevent any oil cargo from moving outwardly through the hull tank breach and, thus, prevents contamination of the adjacent sea water.

OBJECTS OF THE INVENTION

One object of this invention is to provide an oil tanker hull assembly and method of operation which can be constructed with modem super capacity oil tanker ships having 1) an inner main tank oil cargo assembly adapted to receive, support, and convey a primary oil cargo; and 2) an outer hull tank oil cargo assembly provided with a plurality of spaced compartment bulkhead assemblies to be divided into a plurality of compartmentalized hull tanks, each to convey a secondary oil cargo therein and operable to prevent an oil spill into the adjacent sea water on a hull tank breach or failure of the respective compartmentalized hull tanks.

Another object of this invention is to provide an oil tanker hull assembly and method of operation having 1) an inner main tank oil cargo assembly to receive, support, and convey a primary oil cargo; and 2) an outer hull tank oil cargo assembly having a plurality of spaced compartmentalized hull tanks, each provided with a secondary oil cargo therein; and 3) each of the compartmentalized hull tanks are independently operable on being breached to provide movement of the secondary oil cargo therein into adjacent ones of the compartmentalized hull tanks as to remain contained within the oil tanker ship and prevent any oil cargo from being released into the surrounding sea water.

One other object of this invention is to provide an oil tanker hull assembly and method of operation operable to prevent oil spillage in case of accidental hull rupture having 1) an inner main tank oil cargo assembly to receive, support, and convey a primary oil cargo; and 2) an outer hull tank oil cargo assembly mounted about the outer periphery of the inner main tank oil cargo assembly and having compartmentalized hull tanks, each compartmentalized hull tank independently operable on being breached to use a combination of negative pressures on the inside of the hull tanks relative pressure of the sea water outside of the hull tanks and using the advantage of force of liquid displacement due to the sea water having a greater density than the oil cargo so as to force the same upwardly on hull tank breach and into adjacent compartmentalized hull tanks.

A further object of this invention is to provide an oil tanker hull assembly and method of operation having method steps 1) to properly add a primary oil cargo to a main tank oil cargo assembly; and 2) to properly add a secondary oil cargo to an outer hull tank oil cargo assembly and, due to proper use of a hull tank oil cargo line being below a sea level line, provides for pressure relationships and density characteristics between sea water and the oil cargo so as to prevent oil spillage into the adjacent sea water on a hull tank breach.

Still, one other object of this invention is to provide an oil tanker hull assembly and method of operation which is economical in construction; effective in use; uses basic negative pressure relationships with the force of gravity and the force of liquid displacement due to differences in density between oil cargo and sea water to prevent oil spillage into the adjacent sea water on compartmentalized hull tank ruptures; and substantially maintenance free.

Various other objects, advantages, and features of the invention will become apparent to those skilled in the art from the following discussion, taken in conjunction with the accompanying drawings, in which:

FIGURES OF THE INVENTION

FIG. 3 is a sectional diagram illustrating the oil tanker hull assembly with a main tank oil cargo assembly with a hull tank oil cargo assembly mounted thereabout and relationship of oil cargo lines to surrounding sea level;

FIG. 4 is a sectional diagram similar to FIG. 4 illustrating flow of the oil cargo and sea water on a hull tank rupture;

Figure 1:
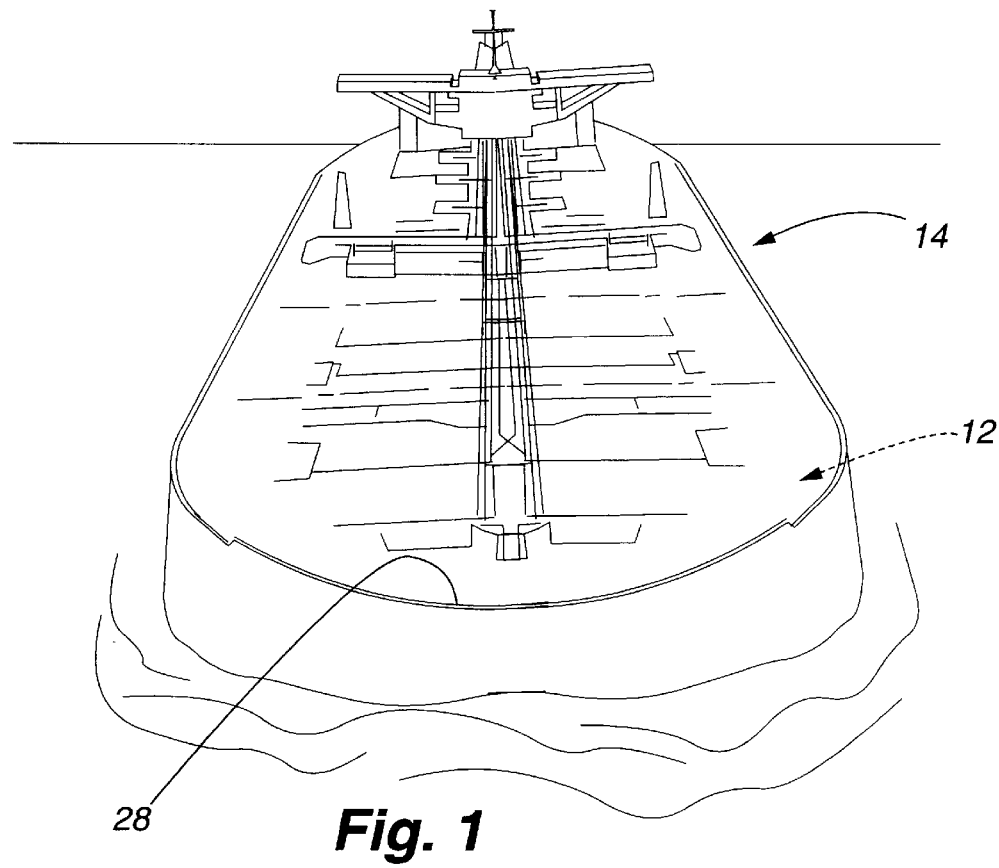
FIG. 1 is a perspective view of a modern oil tanker ship.
Figure 2:
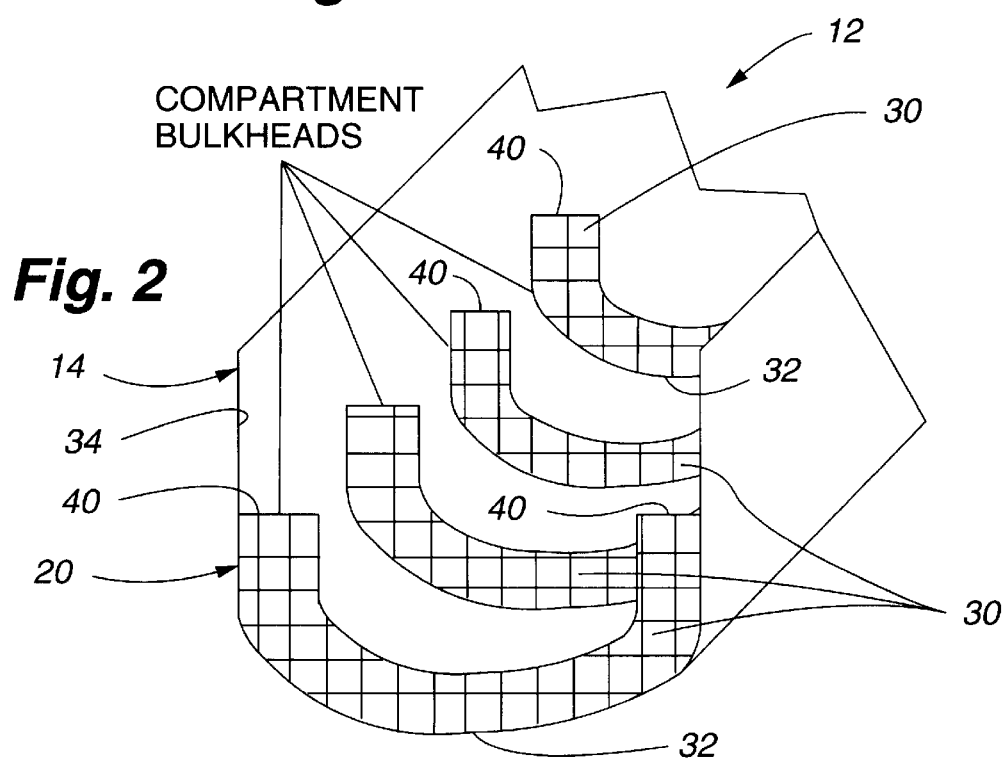
FIG. 2 is a schematic diagram illustrating an oil tanker hull assembly of this invention.
Figure 5:
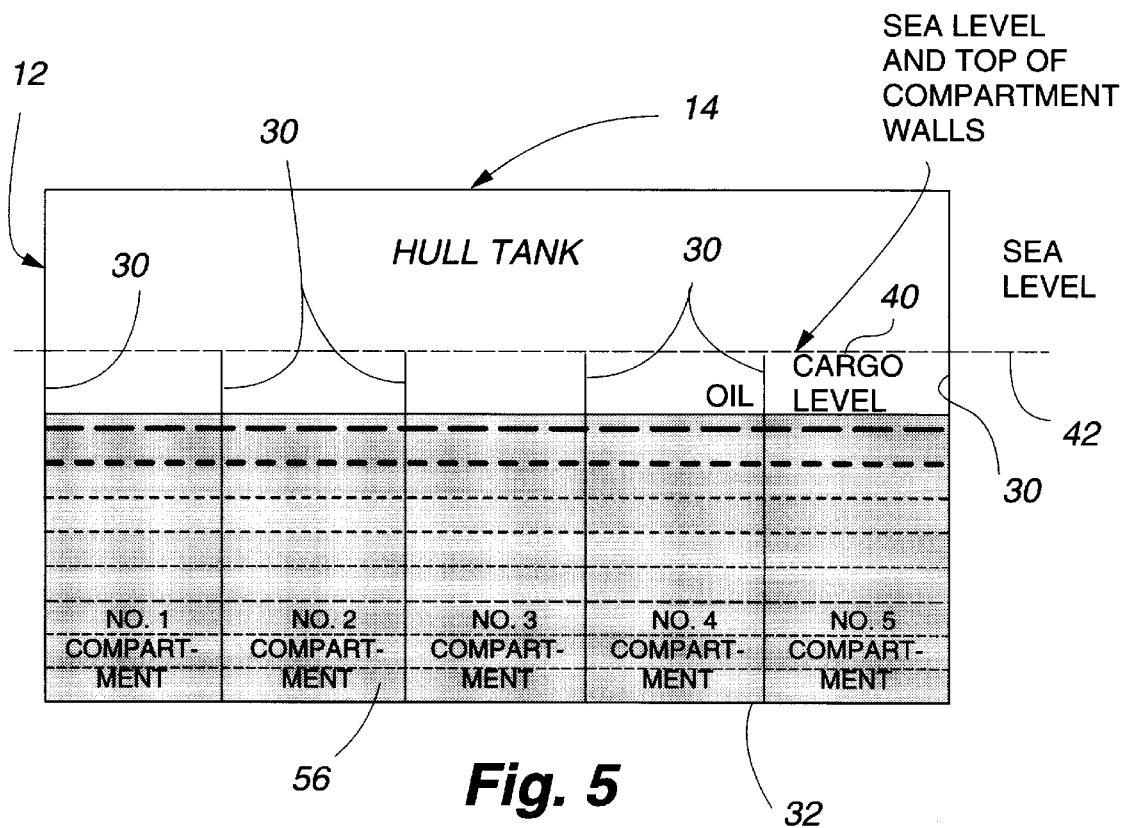
FIG. 5 is a schematic diagram showing the oil cargo and levels thereof prior to hull tank rupture.

The following is a discussion and description of preferred specific embodiments of the oil tanker hull assembly and method of operation of this invention, such being made with reference to the drawings, whereupon the same reference numerals are used to indicate the same or similar parts and/or structure. It is to be understood that such discussion and description is not to unduly limit the scope of the invention.

DESCRIPTION OF THE INVENTION

On referring to the drawings in detail, and in particular to FIG. 1, an oil tanker hull assembly and method of operation of this invention, indicated generally at 12, includes a large modern super capacity oil tanker ship 14.

The oil tanker hull assembly and method of operation 12 is operable to prevent oil spillage in case of an accidental hull breach, rupture, or failure. This may occur due to hitting a submerged reef formation or an iceberg. This invention is operable to prevent oil spill and loss of wildlife as occurred in the Valdez ship accident in Alaska.

The oil tanker hull assembly 12 includes 1) an inner main tank oil cargo assembly 18; and 2) an outer hull tank oil cargo assembly 20.

The inner main tank oil cargo assembly 18 is operable to receive, support and convey a primary oil cargo and includes an arcuate bottom wall member 24 which is integral with spaced parallel side wall members 26 and enclosure end wall members 28 at opposite ends thereof.

The inner main tank oil cargo assembly 18 may be provided with a plurality of baffle members to control any splashing or lateral movement of the primary oil cargo therein.

The spaced parallel side wall members 26 form the inside wall of the outer hull tank oil cargo assembly 20 as will be explained.

The outer hull tank oil cargo assembly 20 is operable to receive, support, and convey a secondary oil cargo therein in spaced individual compartmentalized hull tanks as will be noted. The outer hull tank oil cargo assembly 20 includes a plurality of spaced compartment bulkhead assemblies 30 used to divide into the spaced compartmentalized hull tanks.

Each compartment bulkhead assembly 30 cooperates with a bulkhead bottom wall member 32 integral with an outer bulkhead side wall member 34 and an outer bottom wall member 36 extended about the entire outer periphery of the oil tanker ship 14.

Each compartment bulkhead assembly 30 is provided with a top surface 40 which is designed to be in horizontal alignment with the sea level 42 present on the outside of the oil tanker ship 14 when in the fully loaded with oil cargo condition.

It is obvious that the compartment bulkhead assemblies 30 provide a plurality of the compartmentalized hull tanks, each one independently operable on receiving a hull tank breach or rupture 54 therein (FIG. 4) as will be explained.

In order to understand the method of operation of the oil tanker hull assembly 12 of this invention, it is important that we note numerous reference points herein which are important as the main principles being utilized herein are 1) the use of negative pressures being the oil pressure of the secondary oil cargo in the outer hull tank oil cargo assembly 20; and 2) the force of liquid disbursement as the sea water surrounding the oil tanker ship 14 has a greater density than the secondary oil cargo within the outer hull tank oil cargo assembly 20.

In order to utilize this difference in density and pressures, we need to note that there is a sea level line 42 being the exterior water line on the oil tanker ship 14. This sea level line 42 is designed so that, when the oil tanker ship 14 is fully loaded with the primary oil cargo and the secondary oil cargo, the sea level line 42 will be in alignment horizontally or at equal height to the top surface 40 of the compartment bulkhead assemblies 30 to allow proper operation thereof.

Also, we have a main tank oil cargo line 44 which is an upper level of the primary oil cargo 22 within the inner main tank oil cargo assembly 18. This main tank oil cargo line 44 would normally not be altered except for different densities of oil product contained therein but so engineered, designed, and loaded with an oil cargo 56 so that the sea level line 42 is in alignment with the top surface 40.

There is provided a hull tank oil cargo line 46 which is the normal upper limit of the secondary oil cargo which is adapted to be positioned substantially below the sea level line 42 and the top surface 40 for proper operation on a hull tank breach or rupture 54 as will be explained.

Figure 6:
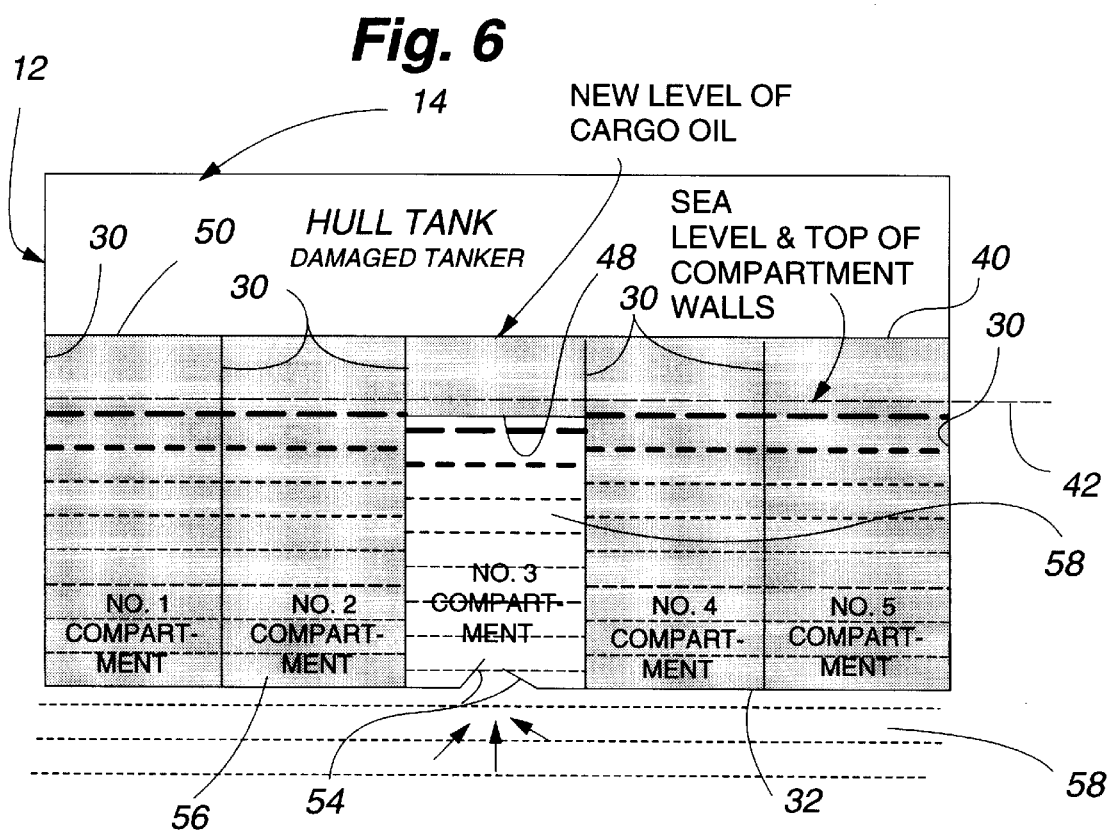
FIG. 6 is a view similar to FIG. 5 showing the equalization of fluid pressure and movement of sea water and oil cargo therein after pressure equalization from the hull tank rupture.

After a hull tank breach or rupture 54 and on equalization of pressures within the breached compartmentalized hull tanks, there will be established an upper new hull tank oil cargo line 50 and a new breached hull tank lower oil cargo line 48 as will be explained and as shown in FIG. 6.

Additionally, in FIG. 6, we have established new levels for the oil cargo 56 and sea water 58 within the breached area of the ruptured compartmentalized hull tanks.

USE AND OPERATION OF THE INVENTION

In the use and operation of the oil tanker hull assembly and method of operation 12 of this invention, it is to be noted that the oil cargo is to be conveyed in a modem super capacity oil tanker ship 14 as noted in FIG. 1.

The oil cargo 56 is to be loaded within the oil tanker ship 14 and in the oil tanker hull assembly 12 in a predetermined engineered and controlled manner.

The controlled manner would be to load the inner main tank oil cargo assembly 18 and the outer hull tank oil cargo assembly 20 in a controlled manner so as to have equalized oil pressures on the opposite sides of the compartment bulkhead assemblies 30 and within the inner main tank oil cargo assembly 18 so as to equalize pressures therein. The pressures would be exerted by the adjacent sea water 58 and affected by the particular sea level line 42 and, additionally, the pressure created by the primary oil cargo and the secondary oil cargo 29.

Therefore, the oil cargo 56 is added to the oil tanker hull assembly 12 in a controlled, pre-engineered manner until it reaches the fully loaded condition as noted in FIG. 3.

The hull tank oil cargo line 46 is positioned substantially below the sea level line 42 which is in alignment with the top surface 40 of the compartment bulkhead assemblies 30. This then presents the normal condition for transporting the oil cargo 56 from one ship terminal to another.

On referring to FIG. 6, it is noted that on the hull tank breach or rupture 54 having occurred, the sea water 58 will flow into the breached compartmentalized hull tank. This sea water 58 flowing into this ruptured compartment would then force the lighter weight oil cargo 56, having less density than the sea water 58, would force the secondary oil cargo within the ruptured compartmentalized hull tank to flow upwardly and overflow the top surface 40 of the compartment bulkhead assemblies 30 and flow into the adjacent ones of the compartmentalized hull tanks.

This pressure differential and density difference between the sea water 58 and the oil cargo 56 causes the sea water 58 to move upwardly to a position below the top surface 40 of the bulkhead side wall members 34. This creates a new breached hull tank lower oil cargo line 48 therein as noted in FIG. 6. Concurrently, this forms a new breached hull tank upper oil cargo line 50 which would be common in all of the compartmentalized hull tanks.

Therefore, it is seen that the oil tanker hull assembly and method of operation 12 is operable to use the pressure differential between sea level 42 and the secondary oil cargo so that there is no oil spillage into the adjacent sea water 58.

It is obvious that a breach may occur directly at a compartmental bulkhead assembly 30 so that adjacent ones of two compartmentalized hull tanks are ruptured but this should not present any problem and the pressure differential and fluid density differences using the force of gravity and force of liquid displacement will operate as previously described to prevent any oil spillage into the adjacent sea water 58.

The oil tanker hull assembly and method of operation of this invention is economical to manufacture; automatic in use and operation due to the forces of gravity and liquid displacement; and substantially maintenance free.

While the invention has been described in conjunction with preferred specific embodiments thereof, it will be understood that this description is intended to illustrate and not to limit the scope of the invention, which is defined by the following claims:

I claim:

1. An oil tanker hull assembly in an oil tanker ship used to carry a crude oil cargo or other chemical composition liquid cargo, comprising:
    a) an inner main tank oil cargo assembly used to receive and convey a primary oil cargo;
    b) an outer hull tank oil cargo assembly surrounding and enclosing said inner main tank oil cargo assembly used to receive and convey a secondary oil cargo;
    c) said outer hull tank oil cargo assembly divided into compartmentalized hull tanks by compartment bulkhead assemblies;
    d) said compartment bulkhead assembly having open tops with a top surface of bulkhead side wall members; and
    e) said top surface positioned at or below sea level when the oil tanker ship is carrying a full load of cargo;
    whereby on rupture of one of said compartmentalized hull tanks, the secondary oil cargo in said ruptured compartmentalized hull tank is forced upwardly and into adjacent ones of said compartmentalized hull tanks by sea water flowing through the rupture until fluid pressures are equalized thus preventing an oil spill into sea water surrounding the oil tanker ship.

2. An oil tanker hull assembly as described in claim 1, wherein:
    a) said compartment bulkhead assemblies provided with a bulkhead bottom wall, an inner wall, a main tank bottom wall member, and an outer bulkhead side wall member to hold the secondary oil cargo therein allowing flow of the secondary oil cargo within a ruptured one of said compartmentalized hull tanks to flow over said top surface and into adjacent ones of said compartmentalized hull tanks on a rupture to one of said compartmentalized hull tanks.

3. An oil tanker hull assembly as described in claim 1, wherein:
    a) the primary oil cargo filled to an upper capacity with a main tank oil cargo line substantially above said top surface and the sea water line to achieve a maximum carrying capacity.

4. An oil tanker hull assembly as described in claim 1, wherein:
    a) each of said compartmentalized hull tanks having a bottom wall, an inner wall, a main tank bottom wall member, and an outer wall separated by said compartment bulkhead assemblies; and
    b) said compartment bulkhead assemblies having said top surface therein positioned above a hull tank cargo line within each of said compartmentalized hull tanks.

5. A tanker hull assembly adapted to be used in a modern, large capacity tanker ship conveying a liquid chemical cargo, comprising:
    a) a main tank cargo assembly used to receive and convey a primary liquid cargo having a main tank cargo line positioned above sea level;
    b) a hull tank cargo assembly surrounding said main tank cargo and used to convey a secondary liquid cargo;
    c) said hull tank cargo assembly having compartmentalized hull tanks separated by compartment bulkhead assemblies;
    d) each of said compartmentalized hull tanks having a bottom wall, an inner wall, and an outer wall separated by said compartment bulkhead assemblies; and
    e) said compartment bulkhead assemblies having a top surface therein positioned above a hull tank cargo line within each of said compartmentalized hull tanks;
    whereby a rupture in one of said compartmentalized hull tanks causes the secondary liquid cargo therein to move upwardly, being forced by sea water flowing through the rupture, into adjacent ones of said compartmentalized hull tanks and preventing any liquid cargo from spilling into sea water surrounding the tanker ship.

6. An oil tanker hull assembly as described in claim 5, wherein:
    a) said main tank cargo assembly has an arcuate bottom wall member, being the inner wall of said compartmentalized hull tanks.

7. An oil tanker hull assembly as described in claim 5, wherein:
    a) the primary oil cargo filled to an upper capacity with said main tank oil cargo line substantially above said top surface and the sea water line to achieve a maximum carrying capacity.

8. A method of conveying a liquid cargo in an ocean traveling tanker ship having a tanker hull assembly with a main tank cargo assembly surrounded by a hull tank cargo assembly separated into individual open top compartmentalized hull tanks, comprising the following steps:
    a) filling a main tank cargo assembly with a primary liquid cargo; and
    b) filling each open top compartmentalized hull tank with a secondary liquid cargo to a hull tank oil cargo line below a sea level line on an exterior of a tanker ship and below a top surface of said open top compartmentalized hull tanks;

whereby a rupture in one of said open top compartmentalized hull tanks causes sea water flowing through the rupture to force the secondary liquid cargo upwardly to flow over said top surface into adjacent ones of said open top compartmentalized hull tanks to prevent liquid cargo spillage into sea water surrounding the tanker ship.

9. An oil tanker hull assembly as described in claim 8, wherein:

a) on filling as set forth in step a), the primary liquid cargo having main tank liquid cargo line at a maximum position therein; and b) on filling as set forth in step b), to a hull tank fluid cargo line which is below said top surface of said open top compartmentalized hull tanks and below the sea level line.

10. A method of conveying a liquid cargo as described in claim 8, including:

a) rupturing one of said open top compartmentalized hull tanks causes sea water to flow through said rupture; and b) flowing of said secondary liquid cargo in the ruptured one of said open top compartmentalized hull tanks upwardly over said top surface of said open top compartmentalized hull tanks into adjacent ones of said open top compartmentalized hull tanks by differential pressure of the sea water.

11. A method of conveying a liquid cargo as described in claim 10, wherein:

a) equalizing pressure within said ruptured one of said open top compartmentalized hull tanks so as to achieve a final new hull tank upper fluid cargo line above said top surface but maintaining all of the sea water within the ruptured one of said open top compartmentalized hull tanks and preventing any secondary liquid cargo in the ruptured one of said oil open top compartmentalized hull tanks from flowing into sea water surrounding the tanker ship.

12. A method of conveying a liquid cargo as described in claim 8, wherein:

a) loading said open top compartmentalized hull tanks to an upper hull tank fluid cargo line; and b) loading said main tank cargo assembly with the primary liquid cargo to place said top surface in generally horizontal alignment with the sea water line present on an exterior surface of the tanker ship.

* * * * *